United States Patent [19]

Hatakeyama

[11] Patent Number: 5,420,869
[45] Date of Patent: May 30, 1995

[54] SEMICONDUCTOR INTEGRATED CIRCUIT DEVICE

[75] Inventor: Atsushi Hatakeyama, Kawasaki, Japan

[73] Assignee: Fujitsu Limited, Kawasaki, Japan

[21] Appl. No.: 241,466

[22] Filed: May 11, 1994

[30] Foreign Application Priority Data

Jun. 17, 1993 [JP] Japan .................. 5-146112

[51] Int. Cl.⁶ ............................................ G06F 11/00
[52] U.S. Cl. .................................. 371/21.1; 371/22.3
[58] Field of Search ................ 324/512, 527; 365/201; 371/21.1, 22.2, 22.3, 22.5

[56] References Cited

U.S. PATENT DOCUMENTS 4,558,232 12/1985 Simpson .
4,970,727 11/1990 Miyawaki et al. .
5,170,077 12/1992 Schreck .
5,341,096 8/1994 Yamamura .................. 371/22.3

FOREIGN PATENT DOCUMENTS 0238283 9/1987 European Pat. Off. .
0289370 11/1988 European Pat. Off. .

Primary Examiner—Vincent P. Canney
Attorney, Agent, or Firm—Armstrong, Westerman, Hattori, McLeland & Naughton

[57] ABSTRACT

A semiconductor integrated circuit device includes an external connection terminal receiving a normal signal varying between a high potential and a low potential, and a test mode setting signal, an input circuit which is connected to the external connection terminal and receives the normal signal via the external connection terminal, an n-channel field effect transistor having a gate connected to the external connection terminal, a drain coupled to a first voltage line via a load element, and a source connected to a second voltage line. The second voltage line is at a potential approximately equal to said high potential. The first voltage line is at a potential equal to or higher than the sum of the high potential and a threshold voltage of the n-channel field effect transistor. The test mode setting signal of a potential equal to or higher than the sum of the high potential and the threshold voltage is applied to the n-channel field effect transistor. A test mode setting signal detecting signal used to initiate a test of the semiconductor integrated circuit device is output via the drain of the n-channel field effect transistor.

12 Claims, 17 Drawing Sheets

FIG. I PRIOR ART

SEMICONDUCTOR INTEGRATED CIRCUIT DEVICE

BACKGROUND OF THE INVENTION

1. Field of the Invention

The present invention generally relates to semiconductor integrated circuit devices, and more particularly to a semiconductor integrated circuit device in which the test functions of a built-in test circuit are activated in response to a test mode setting signal, which is applied to an external connection terminal and is higher than a voltage applied thereto in a normal operation mode.

Recently, semiconductor integrated circuit devices have been designed to have advanced functions and an increased integration density. It takes an extremely long time to test such semiconductor integrated circuit devices in order to detect defects introduced during the production process. Under the above circumstances, a semiconductor integrated circuit device with a built-in test circuit has been developed in which the test functions of a built-in test circuit are activated in response to a test mode setting signal, which is applied to an external connection terminal and is higher than a voltage applied thereto in a normal operation mode.

2. Description of the Prior Art

FIG. 1 shows an essential feature of a semiconductor integrated circuit device 1 as described above. The semiconductor integrated circuit device 1 includes an external connection terminal 2 to which a normal signal is applied in a normal operation mode. For example, the normal signal has a high potential level of 5 [V] and a low potential level of 0 [V]. In a test mode, a test mode setting signal higher than 5 [V] is applied to the external connection terminal 2.

The device 1 includes an input first-stage circuit 3, which receives the signal applied to the external connection terminal 2. The device 1 includes a test mode setting signal detecting circuit 4, which detects the test mode setting signal applied to the external connection terminal 2. The device 1 includes a test function activating signal generating circuit 5, which generates a test function activating signal when the test mode setting signal is detected by the test mode setting signal detecting circuit 4.

The test mode setting signal detecting circuit 4 and the test function activating signal generating circuit 5 are configured as shown in FIG. 2. The detecting circuit 4 includes n-channel metal oxide semiconductor (hereinafter simply referred to as nMOS) transistors $6_1$, $6_2$, $6_3$, . . . , $6_{n-1}$ and $6_n$ (n is an integer) and an nMOS transistor 7. The gate of the nMOS transistor 7 is connected to a VCC power supply line, which supplies a power supply voltage of, for example, 5 [V]. The generating circuit 5 includes an inverter 9.

The nMOS transistors $6_1$–$6_n$ are connected in series so that the gates thereof are connected to the drains thereof and the drains and sources are located on the external terminal 2 side and the ground side, respectively. The threshold voltages $V_{TH}$ of the nMOS transistors $6_1$–$6_n$ are selected so that $V_{TH} \times n > 5$ [V]. The drain of the nMOS transistor 7 is connected to the source of the nMOS transistor $6_n$, and the source thereof is grounded. In the normal operation mode, the nMOS transistor 7 is continuously ON. The ON resistance of the nMOS transistor 7 is set equal to, for example, 1 megaohm to a few megaohms.

The inverter 9 has an input terminal connected to a node 10 at which the source of the nMOS transistor $6_n$ is connected to the drain of the nMOS transistor 7, and an output terminal via which the test function activating signal is output.

In the test mode setting signal detecting circuit 4 and the test function activating signal generating circuit 5, when the normal signal having the 5 [V] high level and the 0 V low level is applied to the external connection terminal 2, the nMOS transistors $6_1$–$6_n$ are not turned ON because the threshold voltages $V_{TH}$ of these transistors are higher than 5 [V]. Hence, the node 10 is at the ground level (0 [V]), and the output of the inverter 9 is high (at the high level).

When a voltage higher than $V_{TH} \times n$ is applied to the external connection terminal 2 as the test mode setting signal, the nMOS transistors $6_1$–$6_n$ are turned ON, and the level of the node 10 becomes high, and the output signal of the inverter 9 is switched to the low level. This low-level signal is applied to a test control signal generating circuit (not shown) as the test function activating signal.

In the above-mentioned manner, it becomes possible to detect the test mode setting signal and generate the test function activating signal with a simple structure for the circuits 4 and 5.

FIG. 3 is a graph of input leak characteristics of the test mode setting signal detecting circuit 4. In the graph of FIG. 3, a solid line 11 relates to a case where the threshold voltage of the test mode setting signal detecting circuit 4 is comparatively low, and a solid line 12 relates to a case where the threshold voltage of the circuit 4 is comparatively high. When the input leak characteristic indicated by the solid line 11 is selected, an input leak occurs due to the input signal applied to the external connection terminal 4 in the normal operation. When the input leak characteristic indicated by the solid line 12 is selected, the input leak does not occur due to the input signal applied to the terminal 4, but the input first-stage circuit 3 may be destroyed due to the test mode setting signal being required to be higher than the high level in the normal operation.

With the above in mind, the threshold voltage of the test mode setting signal detecting circuit 4 is selected so as to be high enough to prevent the test mode setting signal from destroying the input first-stage circuit 3 and prevent occurrence of the input leak.

However, the threshold voltages $V_{TH}$ of the nMOS transistors $6_1$–$6_n$ are not equal to each other due to factors introduced during the production process. When the nMOS transistors $6_1$–$6_n$ have deviations from the designed threshold voltage, the deviation of the threshold voltage of the test mode setting signal detecting circuit 4 is equal to n times the sum of the deviations of the nMOS transistors $6_1$–$6_n$, and hence has a great deviation.

Even in the case that the threshold voltage of the test mode setting signal detecting circuit 4 is selected so as to be high enough to prevent the test mode setting signal from destroying the input first-stage circuit 3 and prevent occurrence of the input leak, the input leak will occur if the threshold voltage of the detecting circuit 4 greatly deviates from the designed value toward the low-potential side because of factors introduced during the production process. Devices having the input leak are handled as defective devices.

Further, the test mode setting signal can be changed stepwise only because the threshold voltage of the test mode setting signal detecting circuit 4 can be controlled stepwise only.

SUMMARY OF THE INVENTION

It is a general object of the present invention to provide a semiconductor integrated circuit device in which the above disadvantages are eliminated.

A more specific object of the present invention is to provide a semiconductor integrated circuit device in which the threshold voltage of a test mode setting signal detecting circuit is constant and independent of the production process and an input leak does not occur even in a case where the voltage of a test mode setting signal is low enough to prevent the first-stage of an input circuit from being destroyed, whereby the device can be stably switched to a test mode and the yield can be improved.

The above objects of the present invention are achieved by a semiconductor integrated circuit device comprising:

an external connection terminal receiving a normal signal varying between a high potential and a low potential, and a test mode setting signal;

an input circuit which is connected to the external connection terminal and receives the normal signal via the external connection terminal;

an n-channel field effect transistor having a gate connected to the external connection terminal, a drain coupled to a first voltage line via a load element, and a source connected to a second voltage line, the second voltage line being at a potential approximately equal to the high potential, the first voltage line being at a potential equal to or higher than a sum of the high potential and a threshold voltage of the n-channel field effect transistor, the test mode setting signal of a potential equal to or higher than the sum of the high potential and the threshold voltage being applied to the n-channel field effect transistor, a test mode setting signal detecting signal used to initiate a test of the semiconductor integrated circuit device being output via the drain of the n-channel field effect transistor.

The above objects of the present invention are also achieved by a semiconductor integrated circuit device comprising:

an external connection terminal receiving a normal signal varying between a high potential and a low potential, and a test mode setting signal;

an input circuit which is connected to the external connection terminal and receives the normal signal via the external connection terminal;

a p-channel field effect transistor having a gate connected to the external connection terminal, a source coupled to a first voltage line, and a drain connected to a second voltage line via a current source, the first voltage line being at a potential approximately equal to the low potential, the second voltage line being at a potential equal to or lower than a sum of the low potential and a threshold voltage of the p-channel field effect transistor, the test mode setting signal of a potential equal to or lower than the sum of the low potential and the threshold voltage being applied to the p-channel field effect transistor, a test mode setting signal detecting signal used to initiate a test of the semiconductor integrated circuit device being output via the drain of the p-channel field effect transistor.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of a first embodiment of the present invention.

Figure 4:
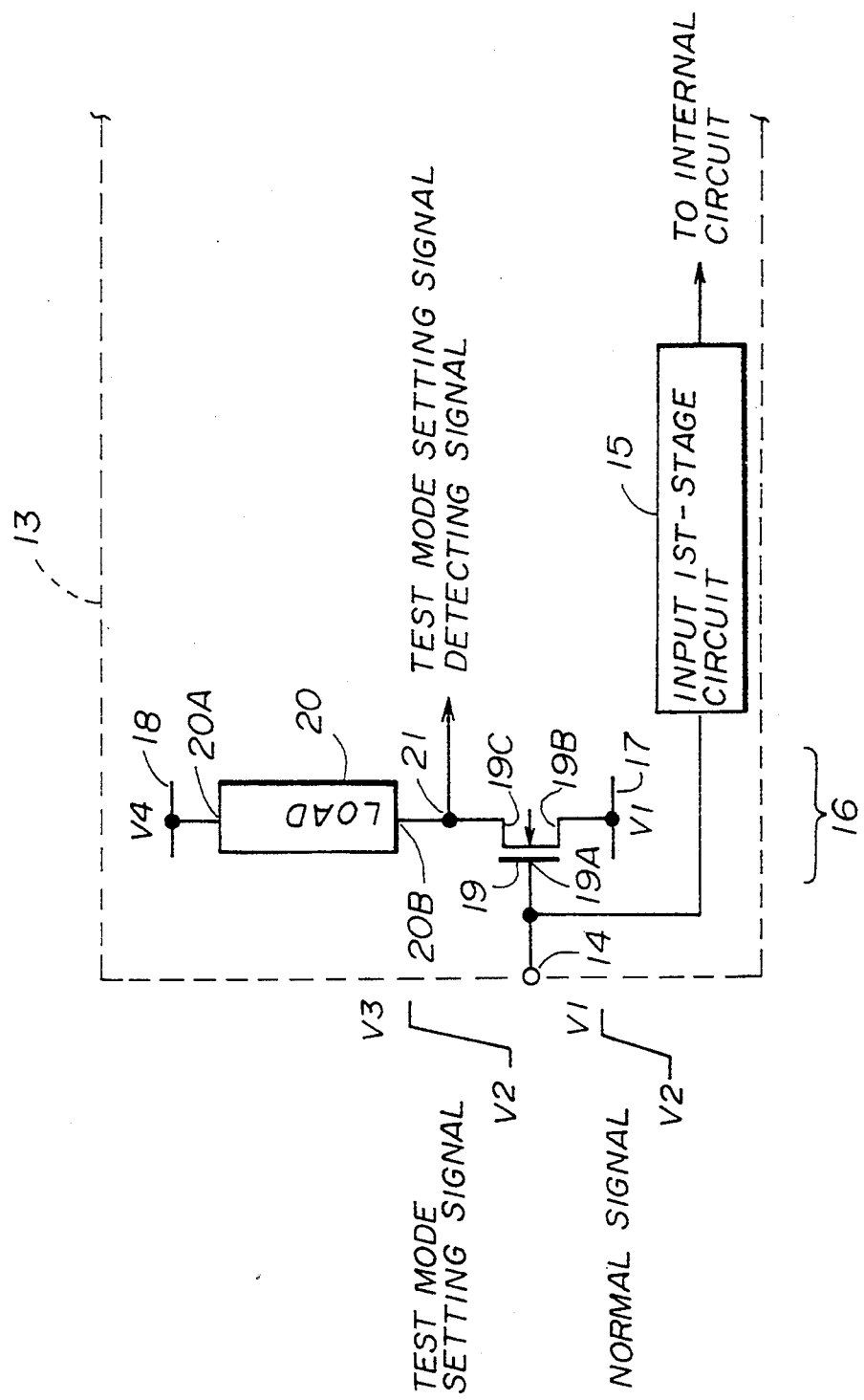
FIG. 4 is a block diagram of an essential part of a first embodiment of the present invention.

FIG. 4 is a block diagram of an essential feature of a first embodiment of the present invention. A semiconductor integrated circuit device 13 includes an external connection terminal 14 to which a normal signal is applied in the normal operation. The normal signal has a high level equal to a voltage V1 and a low level equal to a voltage V2 lower than the voltage V1. In a test mode, a test mode setting signal with a voltage equal to or higher than the sum of the voltage V1 and the threshold voltage of an n-channel field effect transistor such as an nMOS transistor 19 is applied to the external connection terminal 14. Further, the device 13 includes an input first-stage circuit 15 and a test mode setting signal detecting circuit 16. The input first-stage circuit 15 receives the normal signal applied to the external connection terminal 14. The test mode setting signal detecting circuit 16 detects the test mode setting signal applied to the external connection terminal 14.

The test mode setting signal detecting circuit 16 includes a power supply line 17, a voltage supply line 18, the nMOS transistor 19, and a load element 20. The test mode setting signal detecting signal is output via a node 21.

In the normal operation, the normal signal, which has the high level equal to V1 and the low level equal to V2 lower than V1, is applied to the external connection terminal 14. In the test mode, the test mode setting signal, equal to the voltage V3 equal to or higher than the sum of the voltage V1 and the threshold voltage of the nMOS transistor 19, is applied to the external connection terminal 14. A control electrode 19A of the nMOS transistor 19, that is, the gate thereof, is connected to the external connection terminal 14 and the input terminal of the input first-stage circuit 15. A controlled terminal 19C of the nMOS transistor 19, that is, the drain thereof, is connected to a terminal 20B of the load element 20 and the node 21. Another controlled terminal 19B of the nMOS transistor 19, that is, the source of the nMOS transistor 19, is connected to the power supply line 17, which supplies the power supply voltage V1. Another end 20A of the load element 20 is connected to the voltage supply line 18, which supplies the voltage V4 equal to or higher than the sum of the voltage V1 and the threshold voltage of the nMOS transistor 19. The output terminal of the input first-stage circuit 15 is connected to an internal circuit (not shown) of the semiconductor integrated circuit device 13.

Figure 5:
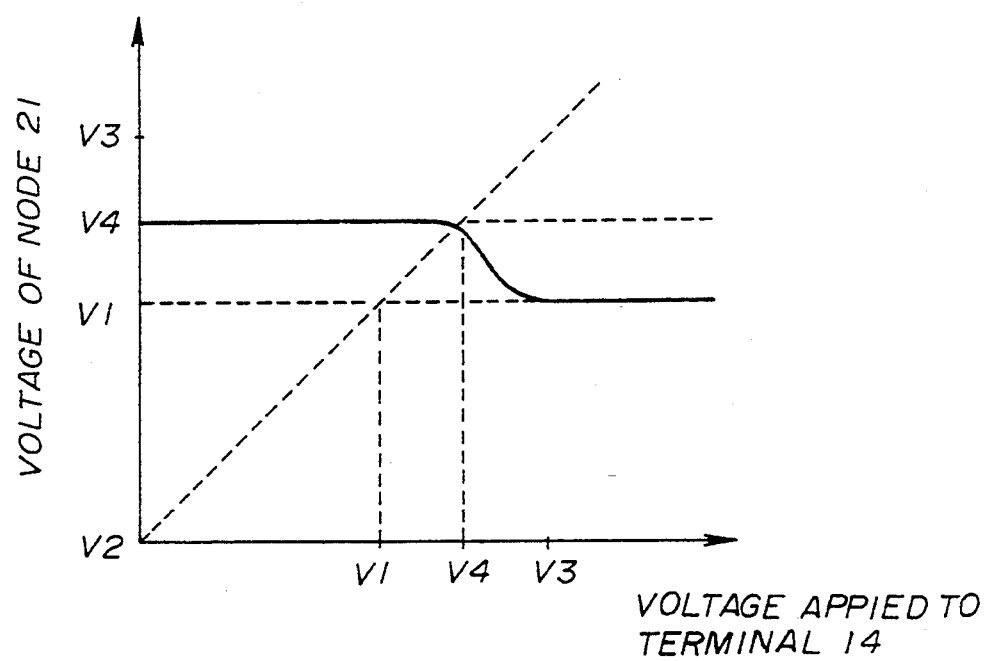
FIG. 5 is a graph of an input/output characteristic of a test mode setting signal detecting circuit shown in FIG. 4.

FIG. 5 is a graph of the input/output characteristic of the test mode setting signal detecting circuit 16 shown in FIG. 4. When the voltage applied to the external connection terminal 14 is lower than the sum of the voltage V1 and the threshold voltage of the nMOS transistor 19, the nMOS transistor 19 is OFF, and the potential of the node 21 is equal to V4. When the voltage applied to the external connection terminal 14 is equal to or higher than the sum of the voltage V1 and the threshold voltage of the nMOS transistor 19, the nMOS transistor 19 is turned ON, and the potential of the node 21 is decreased from V4 to V1.

Hence, in the normal operation, the MOS transistor 19 is not turned ON by the normal signal having the high level equal to V1 and the low level equal to V2 (<V1). In the test mode, the test mode setting signal of the voltage V3 equal to or higher than the sum of the voltage V1 and the threshold voltage of the nMOS transistor 19 is applied to the external connection terminal 14, and hence the nMOS transistor 19 is turned ON. Hence, the test mode setting signal detecting signal equal to V1 is output via the node 21.

Figure 2:
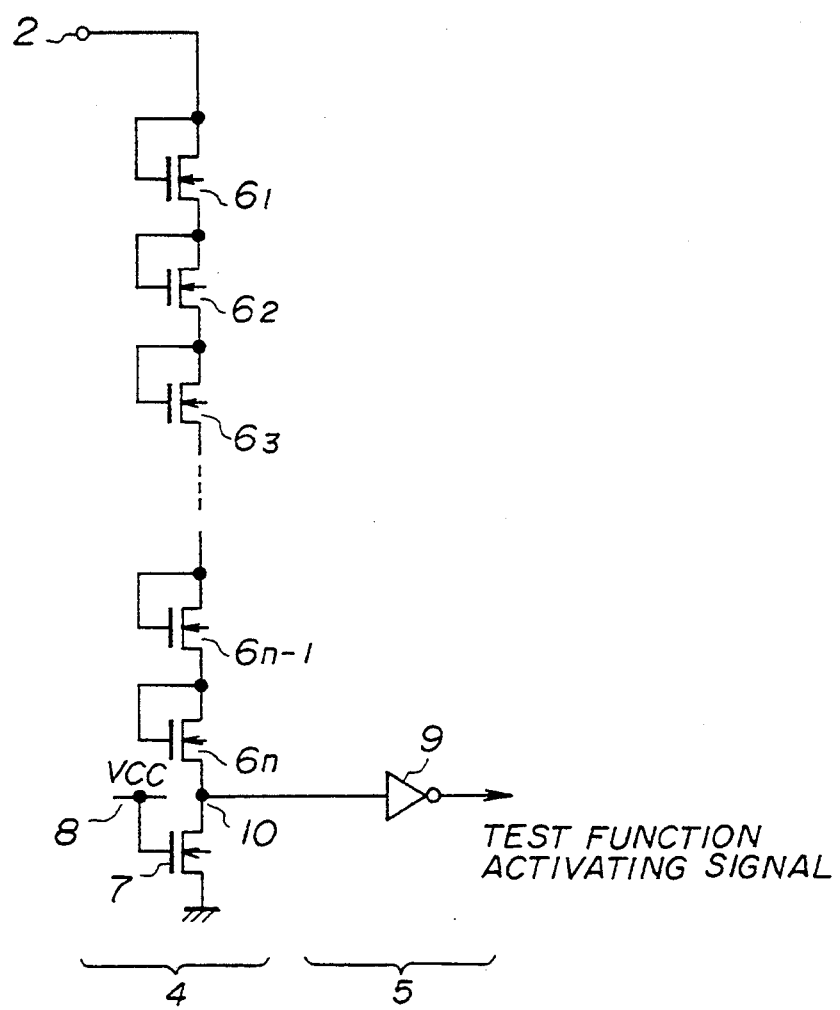
FIG. 2 is a circuit diagram of a test mode setting signal detecting circuit and a test function activating signal generating circuit shown in FIG. 1.
Figure 3:
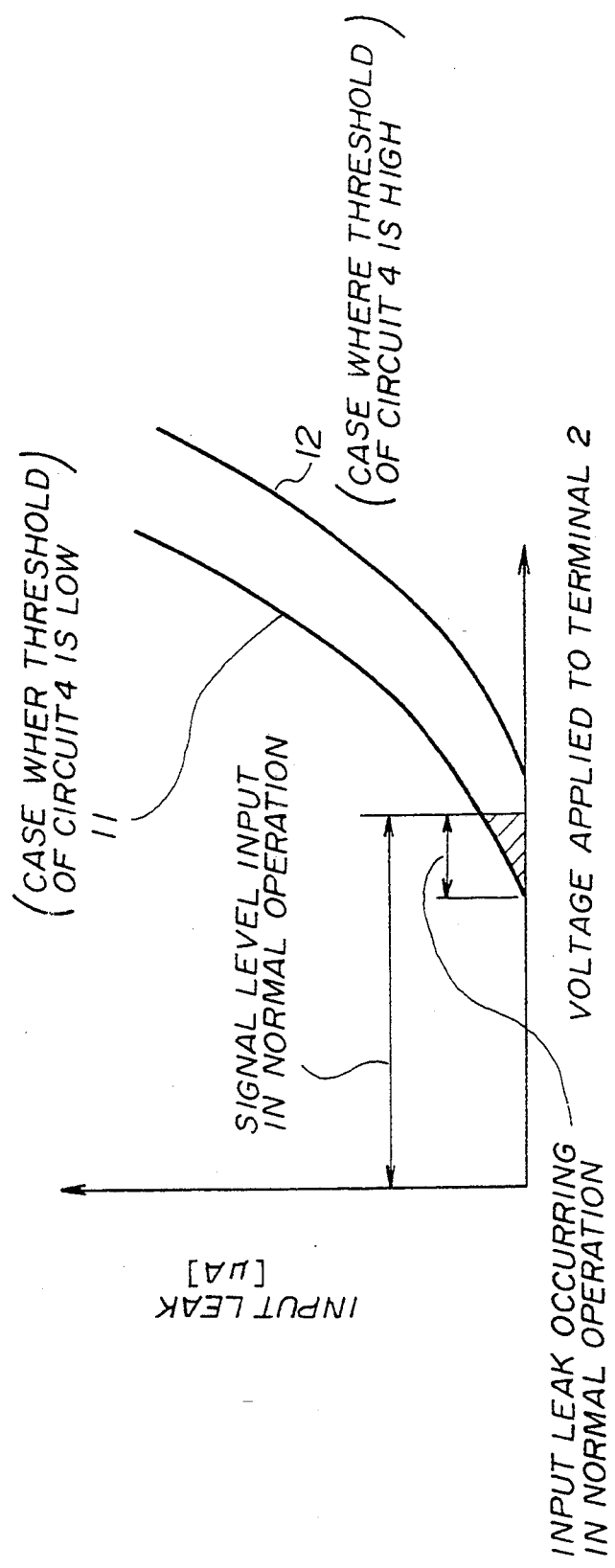
FIG. 3 is a graph of input leak characteristics of the test mode setting signal detecting circuit shown in FIGS. 1 and 2.

Since the normal signal is applied to the gate of the nMOS transistor 19 of the test mode setting signal detecting circuit 16, occurrence of the input leak arising from the normal signal can be prevented even in the case where the voltage of the test mode setting signal is low enough to prevent the input first-stage circuit 15 from being destroyed. Further, the deviation of the threshold voltage of the test mode setting signal detecting circuit 16, which may be introduced during the production process, corresponds to only the deviation of the threshold voltage of the nMOS transistor 19. Hence, such a deviation of the threshold voltage of the test mode setting signal detecting circuit 16 is very much less than that of the threshold voltage of the test mode setting signal detecting circuit 4 shown in FIG. 2.

Figure 6:
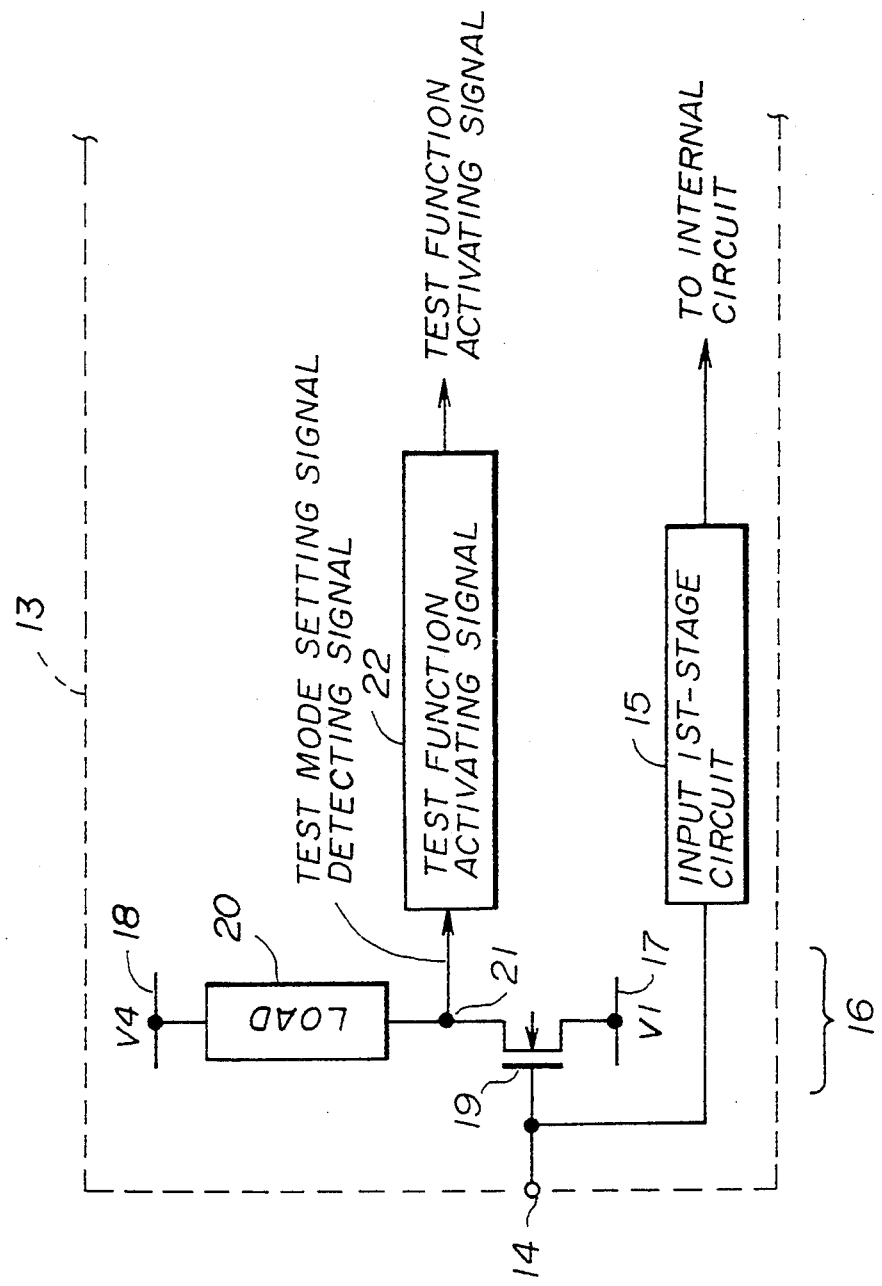
FIG. 6 is a block diagram of a modification of the configuration shown in FIG. 4.

As shown in FIG. 6, a test function activating signal generating circuit 22 can be provided so that it follows the test mode setting signal detecting circuit 16. The circuit 22 converts the level of the node 21 into a logical level of an internal circuit (not shown). The signal at the converted level is applied to the internal circuit as a test function activating signal.

Figure 7:
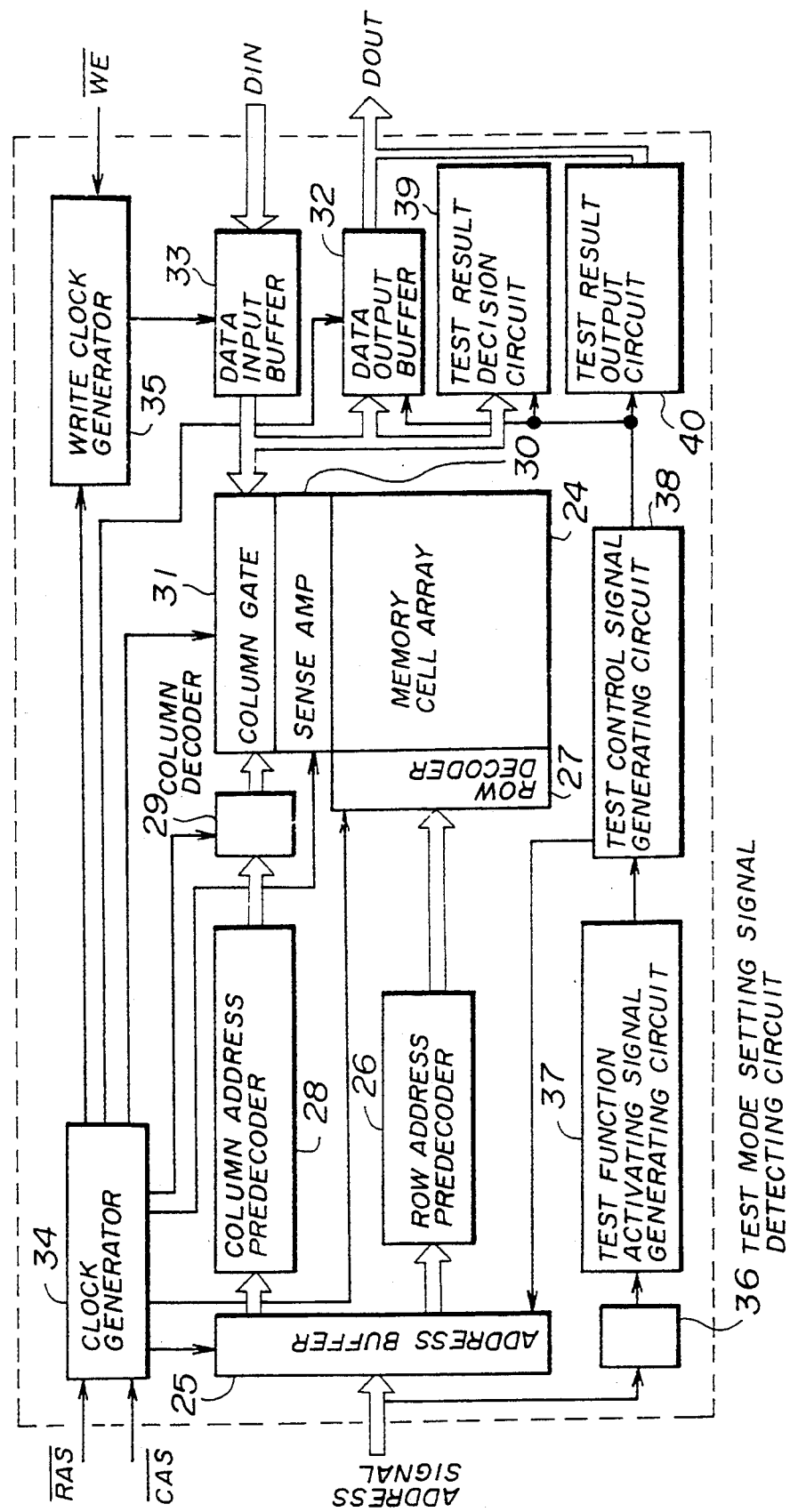
FIG. 7 is a block diagram of a DRAM device to which the configuration shown in FIG. 6 is applied.

FIG. 7 is a block diagram of a DRAM (Dynamic Random Access Memory) device 23 according to the first embodiment of the present invention. The DRAM device 23 includes a memory cell array 24 and an address buffer 25. The memory cell array 24 includes memory cells arranged in a matrix formation. An address signal is applied to the address buffer 25. Further, the DRAM device 23 has the following structural parts.

A row address predecoder 26 predecodes a row address signal contained in the address signal received by the address buffer 25. A row decoder 27 decodes the row address signal predecoded by the row address predecoder 26, and performs a word line selecting operation. A column address predecoder 28 predecodes a column address signal contained in the address signal received by the address buffer 25. A column decoder 29 decodes the column address signal predecoded by the column address predecoder 28, and generates a column selecting signal used to perform a column selecting operation.

A sense amplifier 30 amplifies data read from the memory cell array 24. A column gate 31 performs the column selecting operation on the basis of the column selecting signal output from the column decoder 29. An output buffer 32 latches data read from the memory cell array 24 via the sense amplifier 30 and the column gate 31, and outputs output data DOUT. A data input buffer receives input data DIN which is to be written into the memory cell array 24.

A clock generator 34 externally receives a row address strobe signal/RAS ("/" denotes an active-low signal and corresponds to "bar" shown in FIG. 7) and a column address strobe signal/CAS, and generates therefrom various clock signals functioning as timing signals. A write clock generator 35 externally receives a write enable signal/WE, and outputs a write clock signal to a data input buffer 33.

A test mode setting signal detecting circuit 36, which corresponds to the test mode setting signal detecting circuit 16 shown in FIGS. 4 and 6, detects a test mode setting signal input in the test mode. A test function activating signal generating circuit 37, which corresponds to the circuit 22 shown in FIG. 6, outputs a test function activating signal when the test mode setting signal detecting signal is output from the test mode setting signal detecting circuit 36. A test control signal generating circuit 38 is activated by the test function activating signal output from the test function activating signal generating circuit 37, and generates a test control signal necessary for the test. A test result decision circuit 39 makes a decision as to the test result from data read from the memory cell array 24 in the test mode. A test result outputting circuit 40 outputs the test result output from the test result decision circuit 39 to outside of the DRAM device 23.

The test is performed in the order of write, read, test result decision and test result output. The write operation is performed by repeatedly carrying out an operation such that a plurality of bits, for example, 16 bits are simultaneously written into a plurality of memory cells of the memory cell array 24. The read operation is performed by reading data from the plurality of memory cells into which data are simultaneously written. The test result decision is made by determining whether or not the data read from the memory cells into which data is simultaneously written coincide with each other.

Figure 8:
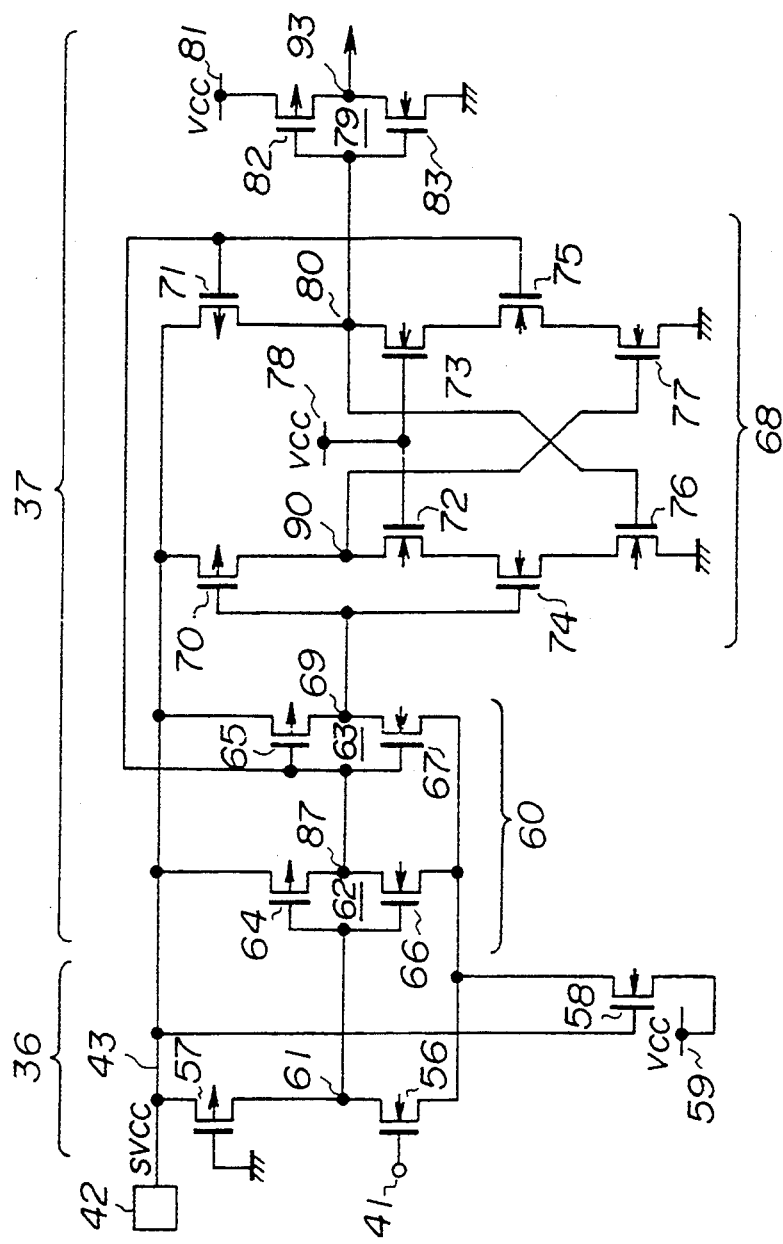
FIG. 8 is a circuit diagram of the test mode setting signal detecting circuit and a test function activating signal generating circuit used in the first embodiment of the present invention.

FIG. 8 is a circuit diagram of the test mode setting signal detecting circuit 36 and the test function activating signal generating circuit 37. The detecting circuit 36 includes an address signal input terminal 41 to which an address signal Ai is applied in the normal operation. The address signal Ai has the high level equal to VCC (for example, 5 [V]) and the low level equal to VSS (for example, 0 [V]). In the test mode, the test mode setting signal of a voltage equal to or higher than VCC+VTH (VTH denotes the threshold voltage of an nMOS transistor 58 corresponding to the nMOS transistor 19 shown in FIGS. 4 and 6) is applied to the address signal input terminal 41. Further, the detecting circuit 36 includes an SVCC generating circuit 42, which generates a voltage SVCC equal to or higher than VCC+VTH. A SVCC line 43 supplies the voltage SVCC generated by the SVCC generating circuit 42.

Figure 9:
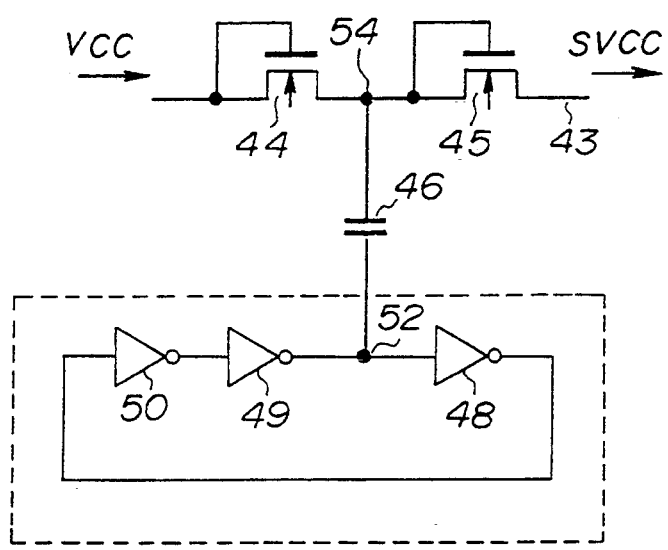
FIG. 9 is a circuit diagram of an SVCC generating circuit used in the first embodiment of the present invention.

FIG. 9 is a circuit diagram of the SVCC generating circuit 42, which is made up of nMOS transistors 44 and 45, a capacitor 46 and a ring oscillator 47. The ring oscillator 47 includes inverters 48, 49 and 50 connected in a ring formation.

Figure 10:
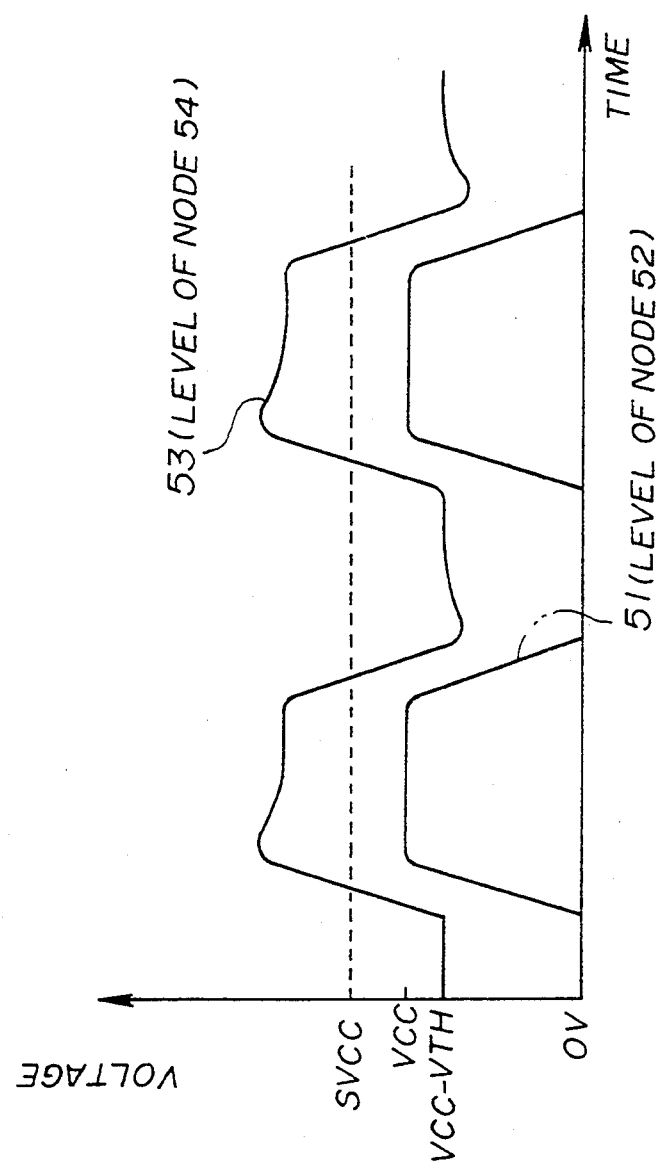
FIG. 10 is a waveform diagram of the operation of the SVCC generating circuit shown in FIG. 9.

FIG. 10 is a waveform diagram showing the operation of the SVCC generating circuit 42 shown in FIG. 9. In FIG. 10, a solid line 51 indicates the output signal of the ring oscillator 47, that is, the level of a node 53 shown in FIG. 9, and a solid line 53 indicates the level of a node 54 shown in FIG. 9. When the potential of the node 52 in the SVCC generating circuit 42 is 0 [V], the potential of the node 54 is at VCC−VTH. When the potential of the node 52 is switched to VCC, the potential of the node 54 becomes higher than the voltage SVCC due to a pumping function of the capacitor 46. The above operation is repeatedly carried out, whereby the potential of the SVCC line 43 becomes equal to SVCC.

Turning now to FIG. 8 again, the test mode setting signal detecting circuit 36 includes an nMOS transistor 56 serving as an input transistor, a pMOS transistor 57 serving as a load of the nMOS transistor 56, and an nMOS transistor 58 for preventing latchup. The source of the nMOS transistor 58 is connected to a VCC power supply line. The potential of the SVCC line 43 rises more slowly than the potential of the VCC power supply line 59, and is lower than the potential of the VCC power supply line 59 immediately after power on.

Hence, if the nMOS transistor 58 is not present and the source of the nMOS transistor 56 is directly connected to the VCC power supply line 59, a current flows to a substrate (an N-type well) via the nMOS transistor 56 and the pMOS transistor 57, the substrate being connected to the drain of the pMOS transistor 57. In this case, the latchup will occur. On the other hand, the use of the nMOS transistor 58 prevents the above latchup. In a case where the voltage of the SVCC line 43 is lower than that of the VCC power supply line, the nMOS transistor 58 is not turned ON, and no current flows to the substrate via the nMOS transistor 56 and the pMOS transistor 57. Hence, the latchup can be prevented.

The test function activating signal generating circuit 37 includes a level conversion circuit 60, which converts the level of the output terminal of the test mode setting signal detecting circuit 36, that is, the level of a node 61 to the high level of SVCC and the low level of VCC. The level conversion circuit 60 includes inverters 62 and 63, pMOS transistors 64 and 65, and nMOS transistors 66 and 67. Each of the inverters 62 and 63 receives the high-potential power supply voltage SVCC and the low-potential power supply voltage VCC. Further, the generating circuit 37 includes a level conversion circuit 68, nMOS transistors 72–77 and a VCC power supply line 78. The level conversion circuit 68 converts the level of the output terminal of the level conversion circuit 60, that is, the level of a node 69 to the high level of SVCC and the low level of 0 [V].

Further, the generating circuit 37 includes an inverter 79, a VCC power supply line 81, a pMOS transistor 82 and an nMOS transistor 83. The inverter 79 functions as a level conversion circuit, which converts the level of the output terminal of the level conversion circuit 68, that is, the level of a node 80 to the high level of VCC and the low level of 0 [V].

Figure 11:
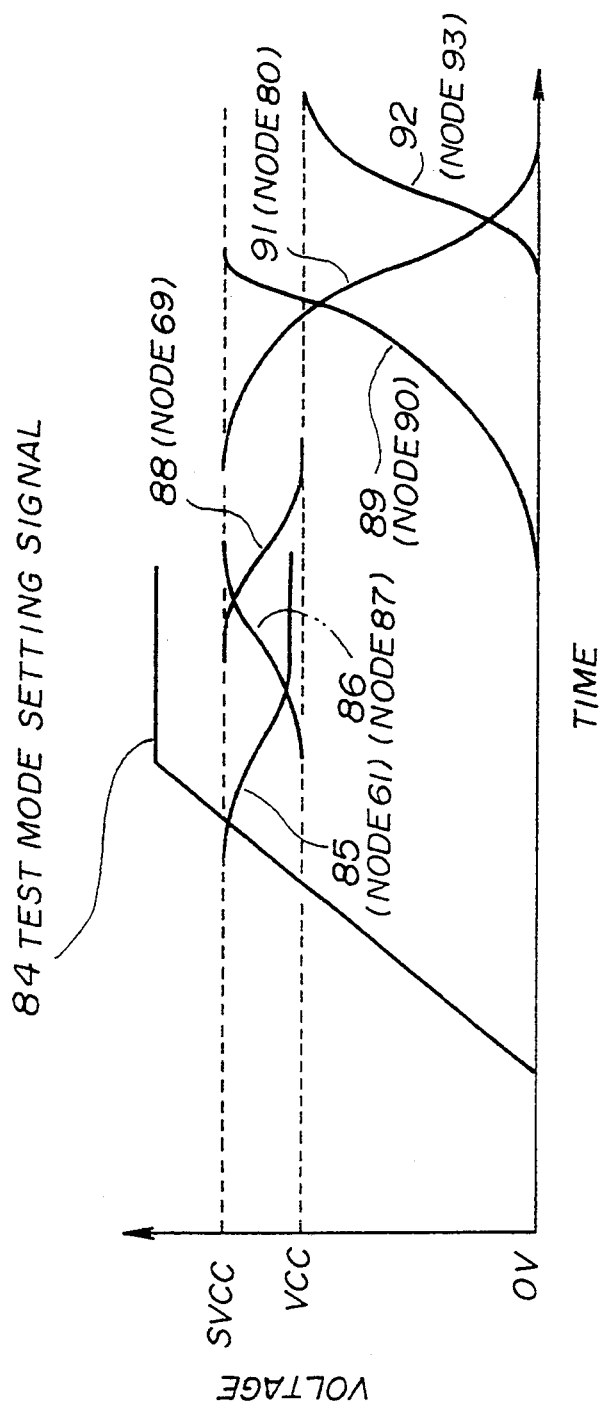
FIG. 11 is a waveform diagram of the operations of the test mode setting signal detecting circuit and the test function activating signal generating circuit shown in FIG. 8.

FIG. 11 is a waveform diagram of the operations of the test mode setting signal detecting circuit 36 and the test function activating signal generating circuit 37. A solid line 84 indicates the test mode setting signal, a solid line 85 indicates the level of the node 61, and a solid line 86 indicates the level of a node 87 shown in FIG. 8. Further, a solid line 88 indicates the level of the node 69, a solid line 89 indicates the level of a node 90 (FIG. 8), a solid line 91 indicates the level of the node 80, and a solid line 92 indicates the level of a node 93.

Figure 12:
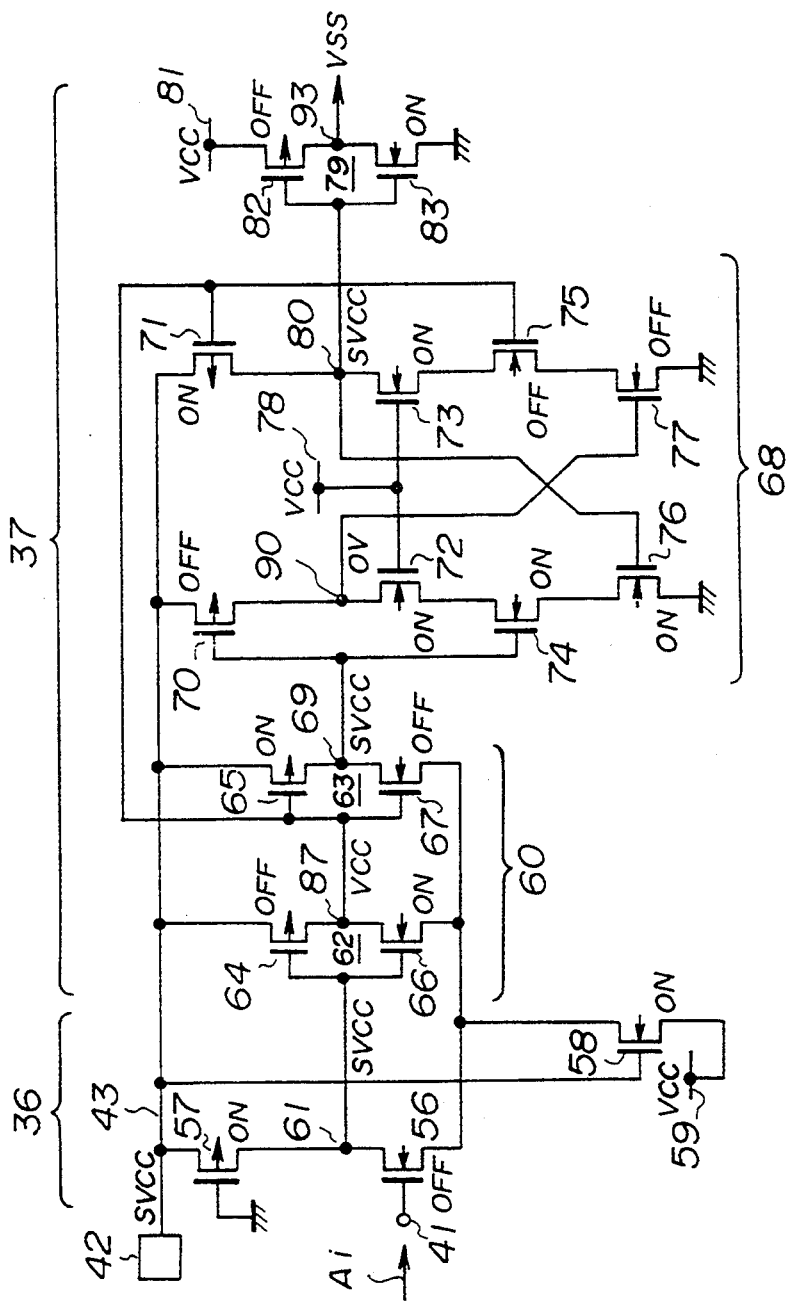
FIG. 12 is a circuit diagram showing the operations of the test mode setting signal detecting circuit and the test function activating signal generating circuit shown in FIG. 8, which circuits operate in a normal operation mode.
Figure 13:
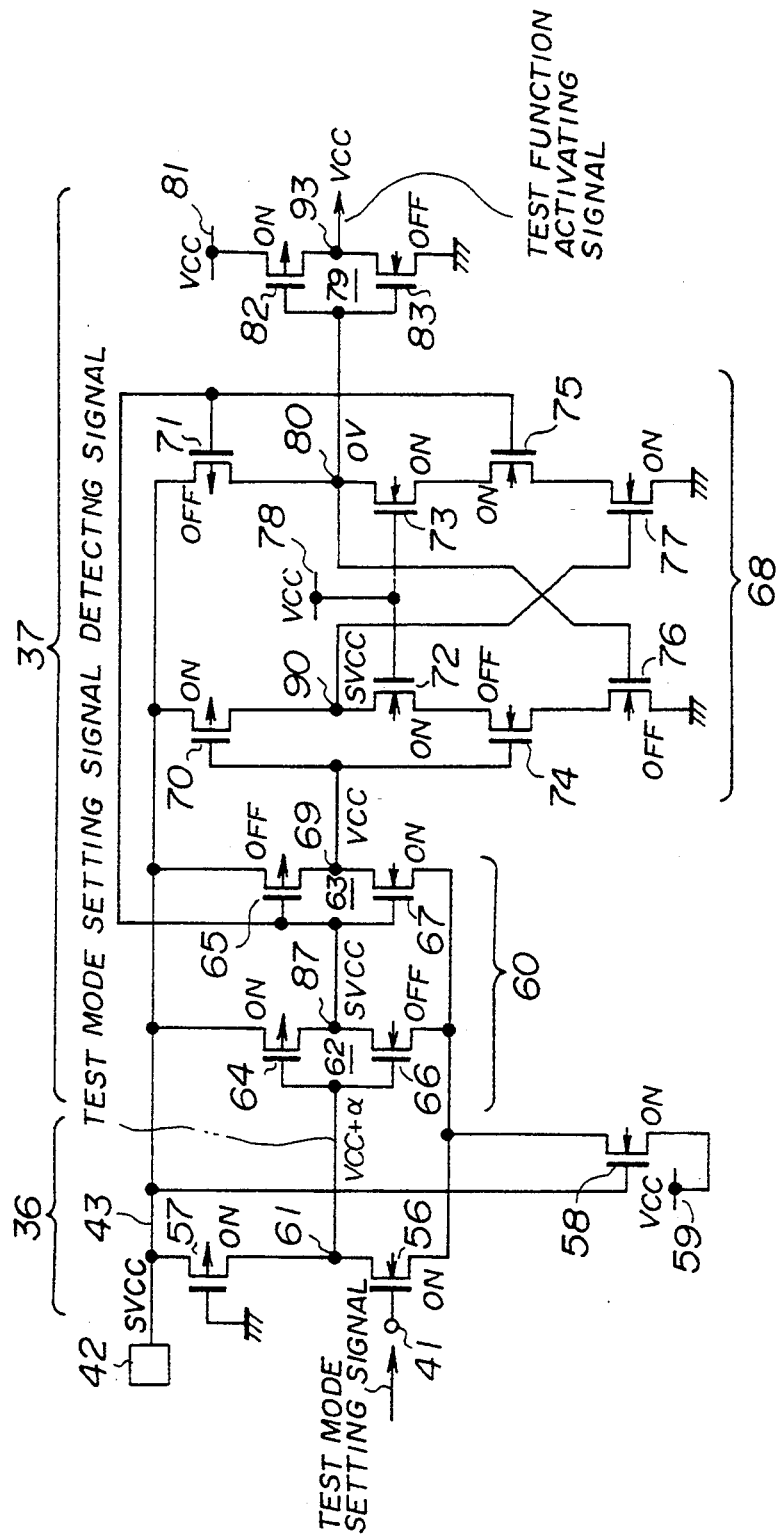
FIG. 13 is a circuit diagram showing the operations of the test mode setting signal detecting circuit and the test function activating signal generating circuit shown in FIG. 8, which circuits operate in a test mode.

FIG. 12 is a circuit diagram of the operations of the test mode setting signal detecting circuit 36 and the test function activating/signal generating circuit 37 which circuits operate in the normal operation. FIG. 13 is a circuit diagram of the operations of the test mode setting signal detecting circuit 36 and the test function activating signal generating circuit 37 which circuits operate in the test mode.

In the test mode setting signal detecting circuit 36 and the test function activating signal generating circuit 37 shown in FIG. 8, a case will be assumed where the potentials of the SVCC line 43 and the VCC power supply lines 58, 78 and 81 have been completely raised, so that the nMOS transistors 58, 72 and 80 are ON. When the address signal Ai having the high level of 5 [V] and the low level of 0 [V] is applied to the address signal input terminal 41 in the normal operation, as shown in FIG. 12, the gate-source voltage of the nMOS transistor 56 does not become equal to or higher than the threshold voltage VTH. Hence, the nMOS transistor 56 is OFF and the potential of the node 61 is equal to SVCC. The voltage SVCC is not detected as the test mode setting signal detecting signal by the level conversion circuit 60.

Hence, in the level conversion circuit 60, the pMOS transistor 64 is OFF, the nMOS transistor 66 is ON, and the potential of the node 87 is equal to VCC. Further, the pMOS transistor 65 is ON, the nMOS transistor 67 is OFF and the potential of the node 69 is equal to SVCC.

In the level conversion circuit 68, the pMOS transistor 70 is OFF, the nMOS transistor 74 is ON, the pMOS transistor 71 is ON, and the nMOS transistor 75 is OFF. Further, the potential of the node 80 is equal to SVCC, the nMOS transistor 76 is ON, the potential of the node 90 is 0 [V], and the nMOS transistor 77 is OFF.

As a result, in the inverter 79, the pMOS transistor 82 is OFF, and the nMOS transistor 83 is ON. Hence, the potential of the node 93 is low, and the test function activating signal is not output.

On the other hand, as shown in FIG. 13, when the test mode setting signal of a voltage equal to or higher than SVCC is applied to the address signal input terminal 41, the gate-source voltage of the nMOS transistor 56 becomes equal to or higher than the threshold voltage VTH, and hence the nMOS transistor 56 is turned ON. Hence, the potential of the node 61 becomes slightly higher than voltage VCC+α. In the first embodiment of the present invention, the above voltage VCC+α is detected as the test mode setting signal detecting signal by the level conversion circuit 60.

In the level conversion circuit 60, the pMOS transistor 64 is turned ON and the nMOS transistor 66 is turned OFF. Further, the node 87 becomes equal to SVCC, and the, the pMOS transistor 65 is turned OFF, and the nMOS transistor 67 is turned ON. Hence, the potential of the node 69 becomes equal to VCC.

Hence, in the level conversion circuit 68, the pMOS transistor 70 is turned ON, the nMOS transistor 74 is turned OFF, the pMOS transistor 71 is turned OFF and the nMOS transistor 75 is turned ON. Thus, the potential of the node 90 becomes equal to SVCC, and the nMOS transistor 77 is turned ON. Further, the potential of the node 80 becomes equal to 0 [V], and the nMOS transistor 76 is turned OFF. As a result, in the inverter 79, the pMOS transistor 82 is turned ON, and the nMOS transistor 83 is turned OFF. Thus, the potential of the node 93 is switched to the high level, which is supplied, as the test function activating signal, to the test control signal generating circuit 38 (see FIG. 7).

Figure 1:
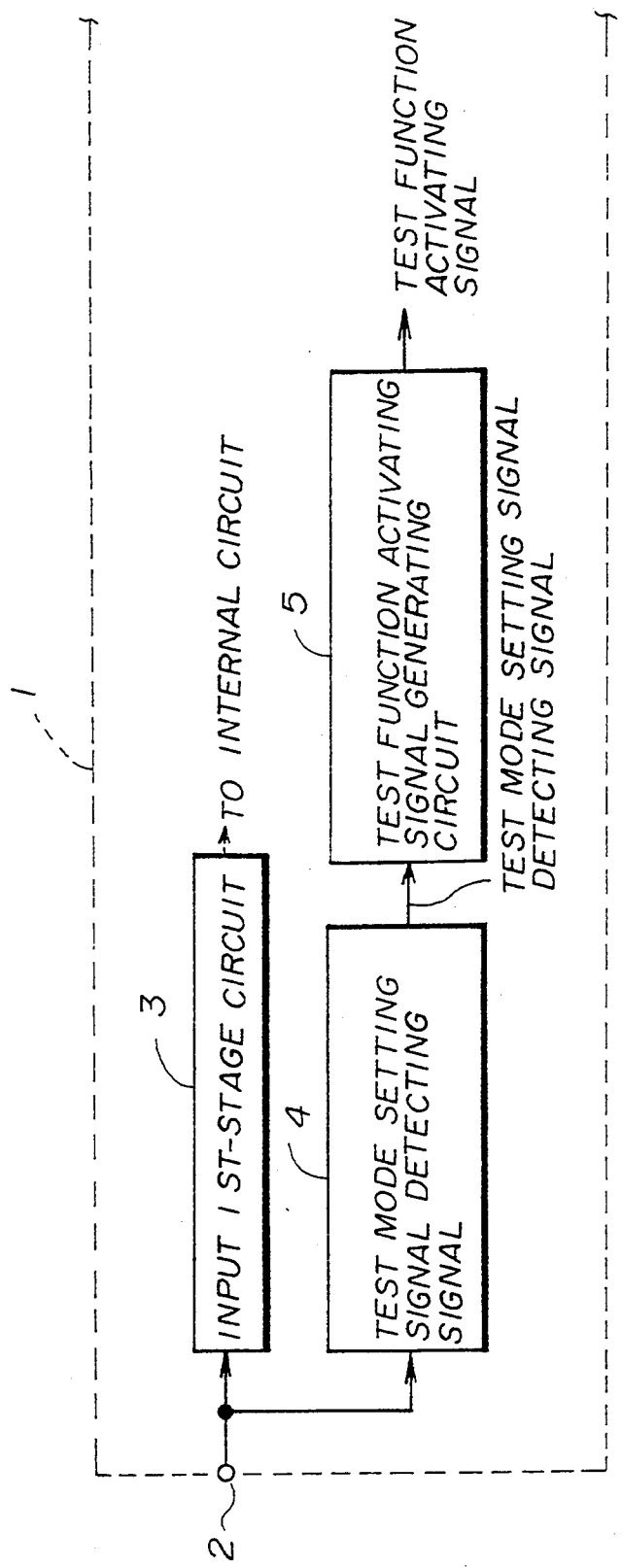
FIG. 1 is a block diagram of an essential part of a conventional semiconductor integrated circuit device.

According to the first embodiment of the present invention, the test mode setting signal detecting circuit 36 is configured so that the normal signal is applied to the gate of the nMOS transistor 56. Hence, even when the voltage of the test mode setting signal is set to be low enough to prevent the input first-stage circuit from being destroyed, the input leak due to the normal signal cannot occur. Further, even if the threshold voltages of the nMOS transistors have deviations due to factors introduced during the production process, the deviation of the threshold voltage of the test mode setting signal detecting circuit 36 corresponds to the deviation of the threshold voltage of only one nMOS transistor. Hence, the deviation of the threshold voltage of the test mode setting signal detecting circuit 36 is very much less than that of the test mode setting signal detecting circuit 4 shown in FIGS. 1 and 2. In other words, the threshold voltage of the test mode setting signal detecting circuit 36 is substantially immune to the production process and is substantially constant. Hence, the test mode setting signal can be detected with high reliability and the yield can be improved.

A description will now be given of a second embodiment of the present invention, in which a pMOS transistor is used instead of the above-mentioned nMOS transistor 19 (56) used in the first embodiment of the present invention.

Figure 14:
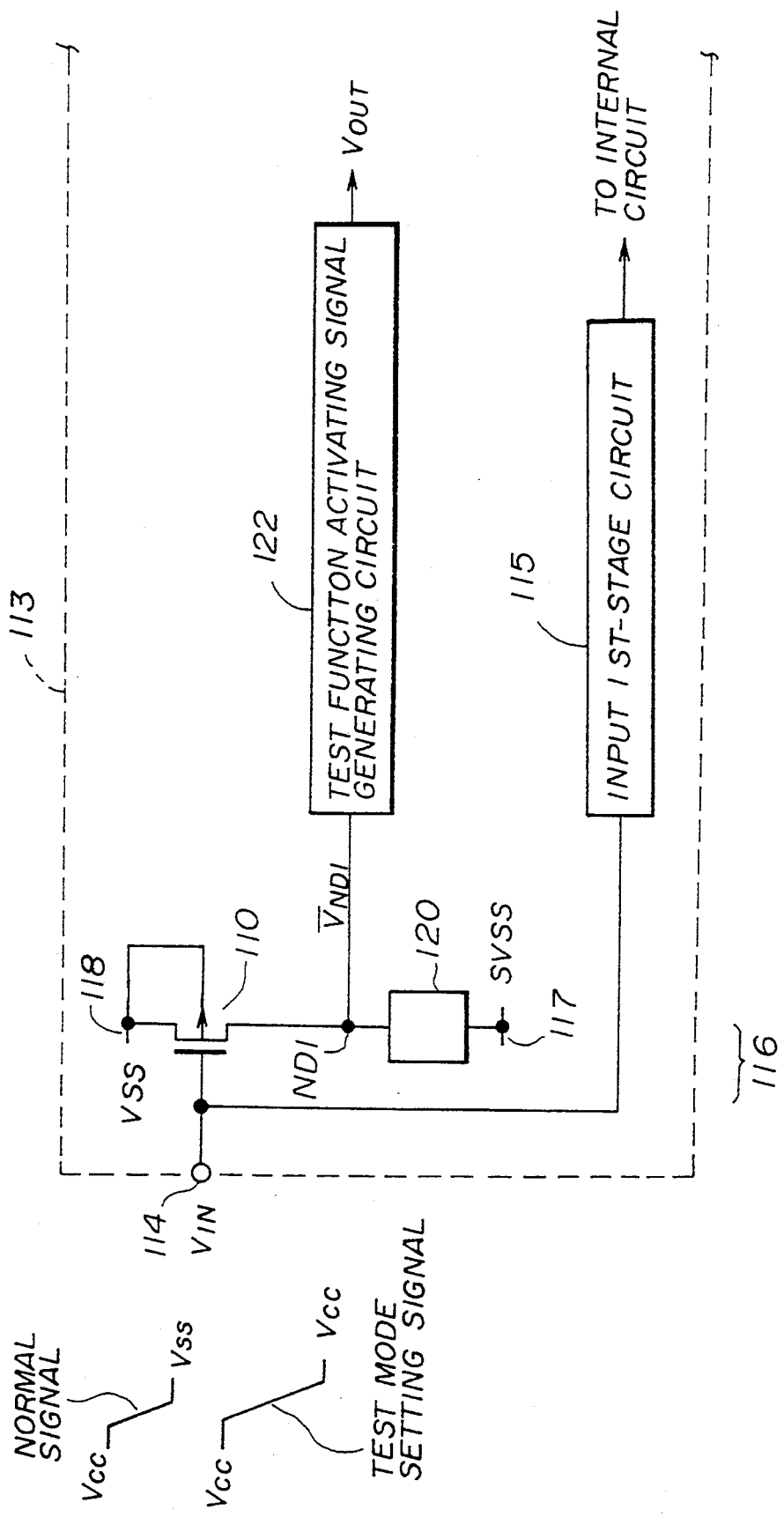
FIG. 14 is a block diagram of an essential part of a second embodiment of the present invention.

FIG. 14 is a block diagram of an essential part of the second embodiment of the present invention. A semiconductor integrated circuit device includes a test mode setting signal detecting circuit 116 connected to an external connection terminal 114, an input first-stage circuit 115 such as an address buffer, and a test function activating signal generating circuit 122. The test mode setting signal detecting circuit 116 includes a p-channel field effect transistor 110 such as a pMOS transistor, and a load element 120 of the pMOS transistor 110 formed with a current source. The source and the backgate of the pMOS transistor 110 are connected to a VSS line 118. The current source 120 connected to the drain of the pMOS transistor 110 is connected to a SVSS line 117. In the configuration shown in FIG. 14, the voltage SVSS is lower than the voltage VSS. The level conversion circuit 122 has an input terminal connected to a node ND1 at which the drain of the pMOS transistor 110 and the current source 120 are connected in series. The level conversion circuit 122 functions as a test function activating signal generating circuit such as the circuit 22 shown in FIG. 6. An input voltage $V_{IN}$ is applied to the gate of the pMOS transistor 110 and an input first-stage circuit 115.

In the normal operation, the input voltage $V_{IN}$ has a high level equal to VCC and a low level equal to VSS. In the test mode, the input voltage $V_{IN}$ has a level equal to SVSS lower than VSS, and serves as a test mode setting signal. In the normal operation mode, the pMOS transistor 110 is not turned ON, and the potential of the node ND1 is equal to SVSS. In the test mode, a voltage equal to or lower than the sum of VSS and $V_{TH}$ ($V_{TH}$ is the threshold voltage of the pMOS transistor 110) is applied to the external connection terminal 114, and the pMOS transistor 110 is turned ON. Hence, the potential of the node ND1 becomes equal to VSS, and accordingly the output voltage $V_{OUT}$ is switched from VCC to VSS.

Figure 15:
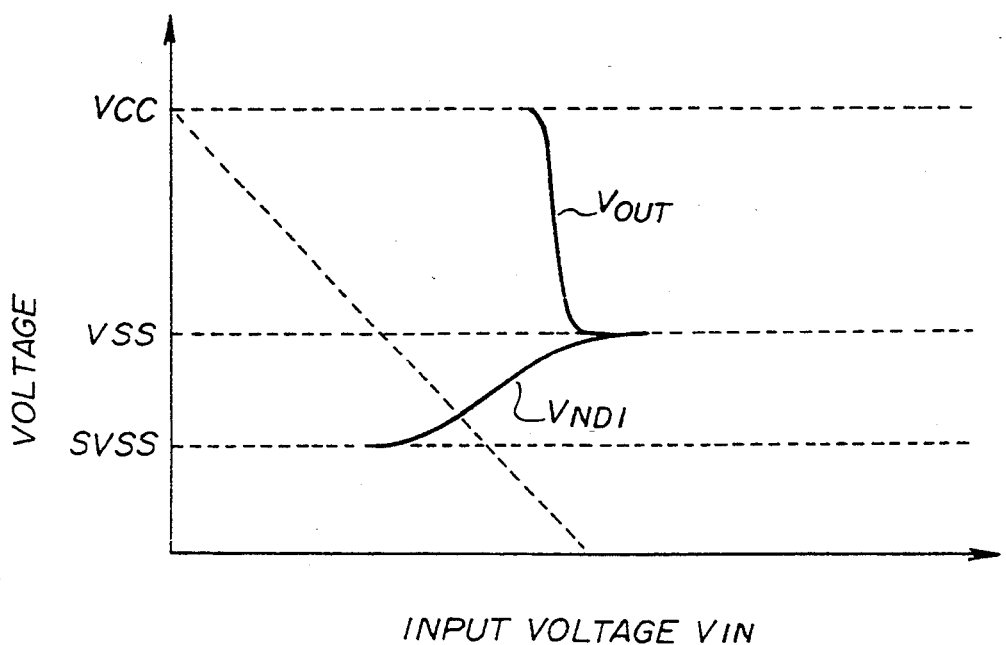
FIG. 15 is a waveform diagram of the configuration shown in FIG. 14.

FIG. 15 is a waveform diagram of a voltage $V_{ND1}$ of the node ND1 and an output voltage signal $V_{OUT}$ of the level conversion circuit 122.

Figure 16:
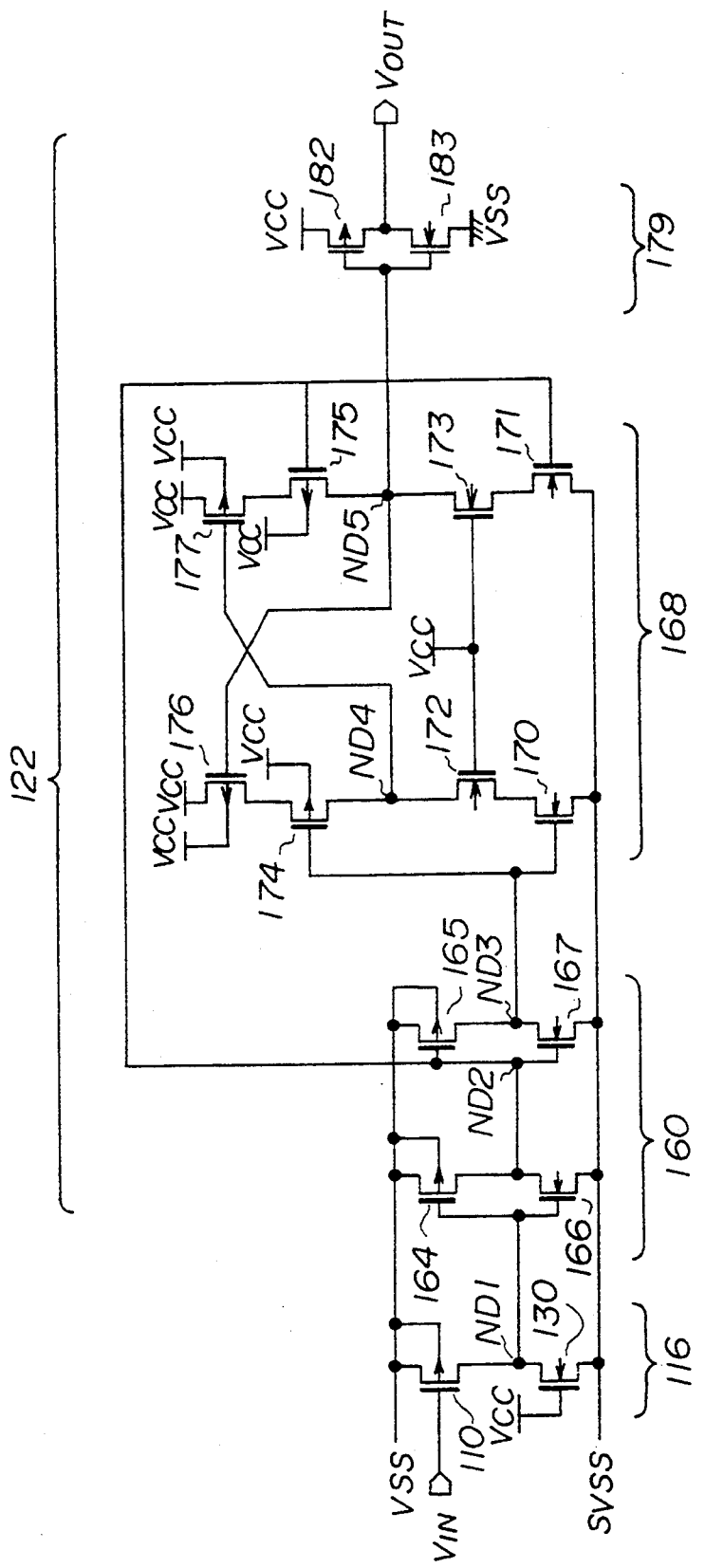
FIG. 16 is a circuit diagram of the details of the configuration shown in FIG. 14.

FIG. 16 shows the details of the configuration shown in FIG. 14. In FIG. 16, parts that are the same as those shown in FIG. 14 are given the same reference numbers as previously. The current source 120 (FIG. 14) of the test mode setting signal detecting circuit 116 includes an nMOS transistor 130 having a gate to which the power supply voltage VCC is applied.

The test function activating signal generating circuit 122 includes level conversion circuits 160, 168 and 179 like the test function activating signal generating circuit 37 shown in FIG. 8. The level conversion circuit 160 includes two CMOS inverters, one of which is made up of a pMOS transistor 164 and an nMOS transistor 166, and the other of which is made up of a pMOS transistor 165 and an nMOS transistor 167. The power supply voltage VSS is applied to the sources of the pMOS transistors 164 and 165, and the voltage SVSS is applied to the sources of the nMOS transistors 166 and 167. The level conversion circuit 168 includes pMOS transistors 174–177 and nMOS transistors 170–173, which transistors are connected as shown in FIG. 16. The level conversion circuit 179 includes a CMOS inverter made up of a pMOS transistor 182 and an nMOS transistor 183.

Figure 17:
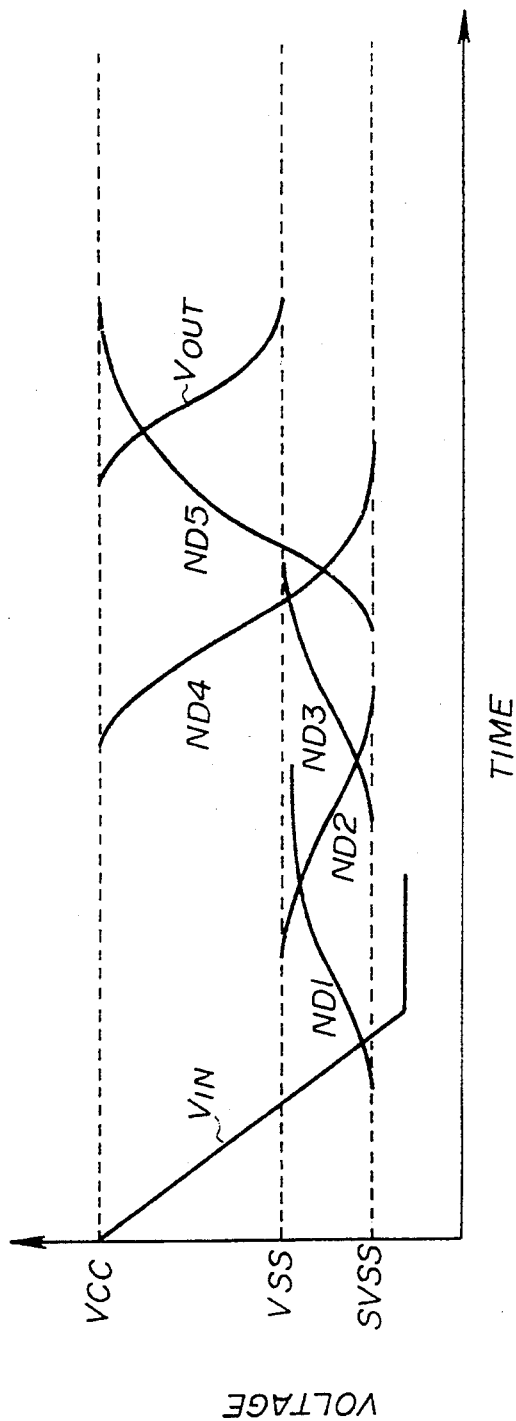
FIG. 17 is a waveform diagram of the operation of the configuration shown in FIG. 16.

FIG. 17 is a waveform diagram of the operation of the circuit shown in FIG. 16 in the test mode. In FIG. 17, ND1, ND2, ND3, ND4 and ND5 denote the potentials of nodes ND1, ND2, ND3, ND4 and ND5, respectively. When the input voltage $V_{IN}$ decreases from the voltage VCC and becomes lower than the voltage SVSS, the pMOS transistor 110 is turned ON and the potential of the node ND1 is increased to the voltage VSS. Further, the potential of the node ND2 is decreased to the voltage SVSS. In response to the level change of the node ND3, the potential of the node ND4 is decreased to the voltage SVSS from the voltage VCC. Further, the potential of the node ND5 is increased to the voltage VCC from the voltage SVSS. In response to the level change of the node ND5, the output voltage $V_{OUT}$ is decreased from the voltage VCC to the voltage VSS.

The voltage SVSS used in the second embodiment of the present invention is generated by the circuit configuration shown in FIG. 9 with a slight modification in which the voltage VCC is applied to the nMOS transistor 45 and the voltage SVSS is output via the nMOS transistor 44.

The circuit configuration shown in FIG. 16 is applied to, for example, a semiconductor integrated circuit device in the same manner as shown in FIG. 7.

The present invention is not limited to the specifically disclosed embodiments, and variations and modifications may be made without departing from the scope of the present invention.

What is claimed is:

1. A semiconductor integrated circuit device comprising:
    an external connection terminal receiving a normal signal varying between a high potential and a low potential, and a test mode setting signal;
    an input circuit which is connected to the external connection terminal and receives the normal signal via the external connection terminal;
    an n-channel field effect transistor having a gate connected to the external connection terminal, a drain coupled to a first voltage line via a load element, and a source connected to a second voltage line, the second voltage line being at a potential approximately equal to said high potential, the first voltage line being at a potential equal to or higher than a sum of the high potential and a threshold voltage of the n-channel field effect transistor, the test mode setting signal of a potential equal to or higher than the sum of the high potential and the threshold voltage being applied to the n-channel field effect transistor,
    a test mode setting signal detecting signal used to initiate a test of the semiconductor integrated circuit device being output via the drain of the n-channel field effect transistor.

2. The semiconductor integrated circuit device as claimed in claim 1, further comprising level conversion means for converting a level of the test mode setting signal detecting signal into an activating signal which has a logical level of an internal circuit of the semiconductor integrated circuit device and is applied to the internal circuit.

3. The semiconductor integrated circuit device as claimed in claim 2, wherein said level conversion means comprises a plurality of level conversion stages.

4. The semiconductor integrated circuit device as claimed in claim 1, further comprising level conversion means for converting a level of the test mode setting signal detecting signal into an activating signal which varies between the high potential and the low potential.

5. The semiconductor integrated circuit device as claimed in claim 1, wherein the load element comprises a CMOS inverter.

6. The semiconductor integrated circuit device as claimed in claim 1, further comprising:
    a memory cell array;
    access means for accessing the memory cell array for writing data into the memory cell array and reading data therefrom;
    input/output means for supplying write data to the memory cell array and for outputting read data to the outside of the semiconductor integrated circuit device; and
    test means for performing a test of the semiconductor integrated circuit device in response to the test mode setting signal detecting signal.

7. A semiconductor integrated circuit device comprising:
    an external connection terminal receiving a normal signal varying between a high potential and a low potential, and a test mode setting signal;
    an input circuit which is connected to the external connection terminal and receives the normal signal via the external connection terminal;
    a p-channel field effect transistor having a gate connected to the external connection terminal, a source coupled to a first voltage line, and a drain connected to a second voltage line via a current source, the first voltage line being at a potential approximately equal to said low potential, the second voltage line being at a potential equal to or lower than a sum of the low potential and a threshold voltage of the p-channel field effect transistor, the test mode setting signal of a potential equal to or lower than the sum of the low potential and the threshold voltage being applied to the p-channel field effect transistor,
    a test mode setting signal detecting signal used to initiate a test of the semiconductor integrated circuit device being output via the drain of the p-channel field effect transistor.

8. The semiconductor integrated circuit device as claimed in claim 7, further comprising level conversion means for converting a level of the test mode setting signal detecting signal into an activating signal which has a logical level of an internal circuit of the semiconductor integrated circuit device and is applied to the internal circuit.

9. The semiconductor integrated circuit device as claimed in claim 8, wherein said level conversion means comprises a plurality of level conversion stages.

10. The semiconductor integrated circuit device as claimed in claim 7, further comprising level conversion means for converting a level of the test mode setting signal detecting signal into an activating signal which varies between the high potential and the low potential.

11. The semiconductor integrated circuit device as claimed in claim 7, wherein the current source comprises a field effect transistor having a gate set to the high potential.

12. The semiconductor integrated circuit device as claimed in claim 7, further comprising:
    a memory cell array;
    access means for accessing the memory cell array for writing data into the memory cell array and reading data therefrom;
    input/output means for supplying write data to the memory cell array and for outputting read data to the outside of the semiconductor integrated circuit device; and
    test means for performing a test of the semiconductor integrated circuit device in response to the test mode setting signal detecting signal.

* * * * *